United States Patent [19]

Fushimi et al.

[11] Patent Number: 4,758,773
[45] Date of Patent: Jul. 19, 1988

[54] SWITCHING DEVICE

[75] Inventors: Ikuo Fushimi, Ebina; Takamasa Sakuragi, Hiratsuka, both of Japan

[73] Assignee: Canon Kabushiki Kaisha, Tokyo, Japan

[21] Appl. No.: 26,476

[22] Filed: Mar. 16, 1987

Related U.S. Application Data

[63] Continuation of Ser. No. 826,907, Feb. 6, 1986, abandoned.

[30] Foreign Application Priority Data

| Feb. 8, 1985 | [JP] | Japan | 60-021769 |
| Feb. 8, 1985 | [JP] | Japan | 60-021770 |
| Feb. 12, 1985 | [JP] | Japan | 60-023652 |

[51] Int. Cl.[4] .............................................. G05F 5/00
[52] U.S. Cl. ..................................... 323/351; 323/284; 323/317
[58] Field of Search ............... 323/274, 284, 315, 316, 323/317, 351

[56] References Cited

U.S. PATENT DOCUMENTS

| 3,898,552 | 8/1975 | Baker | 323/351 |
| 3,899,718 | 8/1975 | Schafe | 323/284 |
| 3,916,220 | 10/1975 | Roveti | 323/284 |
| 4,253,055 | 2/1981 | Gatten | 323/284 |
| 4,458,201 | 7/1984 | Koen | 323/317 |

Primary Examiner—Peter S. Wong
Attorney, Agent, or Firm—Fitzpatrick, Cella, Harper & Scinto

[57] ABSTRACT

A switching device is constituted by two transistors having different emitter areas, a resistor connected to a transistor having a larger emitter area, a driving transistor having a control electrode connected to the collector of the transistor having a smaller emitter area, and a constant-current circuit connected to the two transistors so as to supply equal currents to the two transistors. The bases of the two transistors are equally biased to a constant level. An input current is supplied to the switching device through an input terminal and is divided into the emitter currents of the two transistors. The relative largeness of the collector currents of the two transistors are reversed when the input current exceeds the threshold, thereby to cause the potential change at the collector of the transistor having a smaller emitter area to operate the driving transistor and to control the current supply to the load.

6 Claims, 3 Drawing Sheets

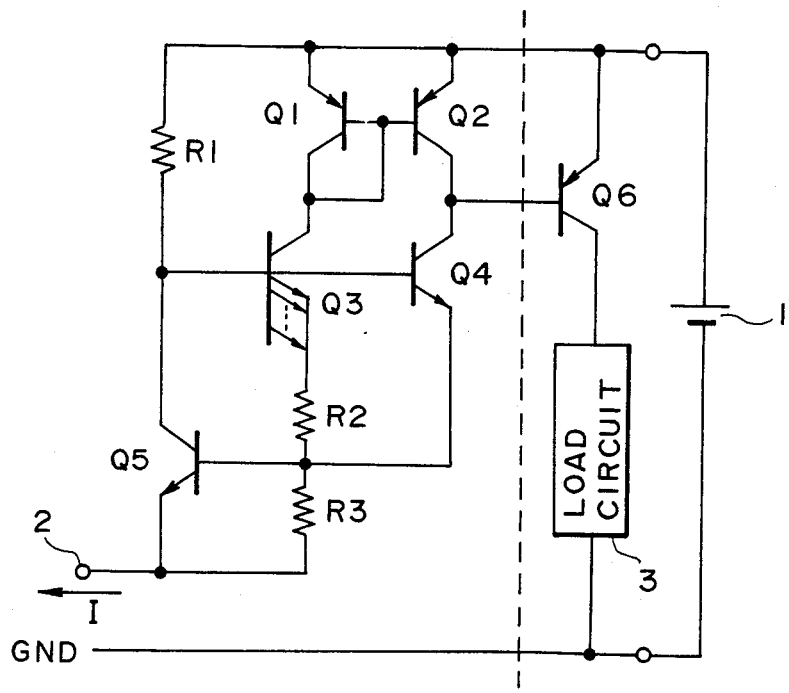
F I G. 3
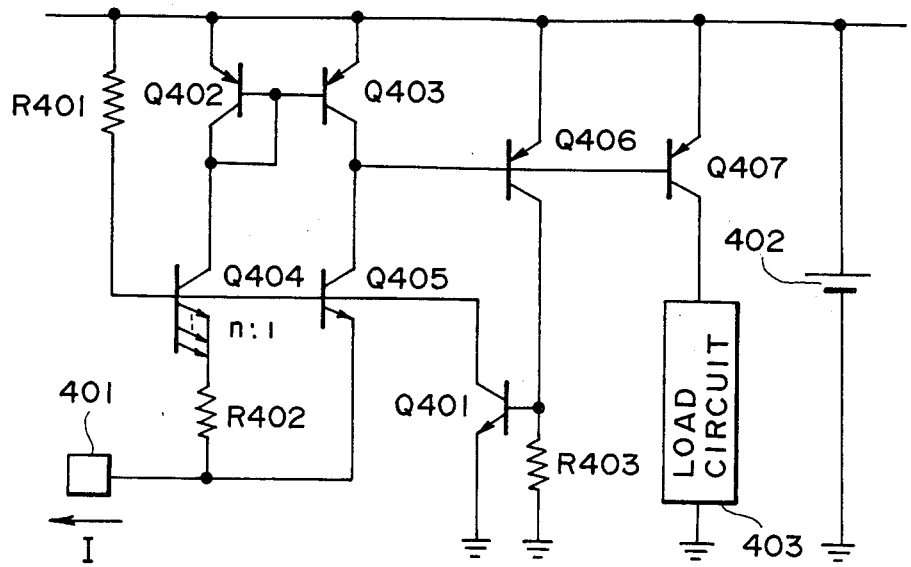
F I G. 4

SWITCHING DEVICE

FIELD OF THE INVENTION AND RELATED ART

This is a continuation of application Ser. No. 826,907, filed Feb. 6, 1986, now abandoned.

The present invention relates to a switching device operating depending on the largeness of a current flowing to an input terminal, particularly to a switching device for controlling a current supplied to a load circuit depending on whether or not an input current exceeds a prescribed threshold.

Conventional switching devices have a problem that a small current is supplied to a load circuit when a current starts to flow to an input terminal, so that a reliable switching operation is not ensured. Further, in the conventional switching devices, similar proglems arise because a current is supplied to a load circuit when a noise current is generated. Further, conventional switching devices are not adapted to wide use because a threshold of an input current cannot arbitrarily be set.

SUMMARY OF THE INVENTION

A primary object of the present invention is to provide a switching device having solved the above mentioned problems involved in the conventional switching devices.

Another object of the present invention is to provide a switching device capable of effecting a reliable switching operation to minimize power consumption, because even when a minute current such as a leakage current flows to an input terminal or a noise current occurs, a current originating from such phenomena is not supplied to a load circuit.

Still another object of the present invention is to provide a switching device, wherein a threshold current can be set to a desired level so that a current level of an external electronic device connected to an input terminal need not be a matter of serious concern.

A still further object of the present invention is to provide a switching device capable of suppressing a current flowing to an input and a load circuit, so that the input and load circuits can be protected with respect to an overcurrent to the load, and when a plurality of loads are driven, breakage of one load does not affect the operation of another load.

According to the present invention, there is provided a switching device for supplying a current to a load only when a current flowing at an input terminal exceeds a prescribed threshold; said switching device comprising: two transistors including a transistor having a larger emitter area and a transistor having a smaller emitter area, a first resistor connected to the emitter of said transistor having a larger emitter area, a driving transistor having a control electrode connected to the collector of said transistor having a smaller emitter area, and a constant-current circuit connected to said two transistors in such a manner as to supply equal currents to said two transistors, the bases of said two transistors being equally biased to a constant level, the currents flowing at the emitters of said two transistors providing said current flowing at the input terminal, the relative magnitude of the collector currents of said two transistors being reversed when the current flowing at the input terminal exceeds said threshold, the reversal of the relative magnitude of the collector currents causing the potential change at the collector of said transistor having a smaller emitter area to operate said driving transistor thereby controlling the current supply to the load. There may be further added means for providing an upper limit to the input current and/or the current supplied to the load.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1, 3 and 4 are circuit diagrams of embodiments of the switching device according to the present invention;

DETAILED DESCRIPTION OF PREFERRED EMBODIMENTS

Hereinbelow, the present invention is explained with reference to preferred embodiments while referring to the accompanying drawings.

Figure 1:
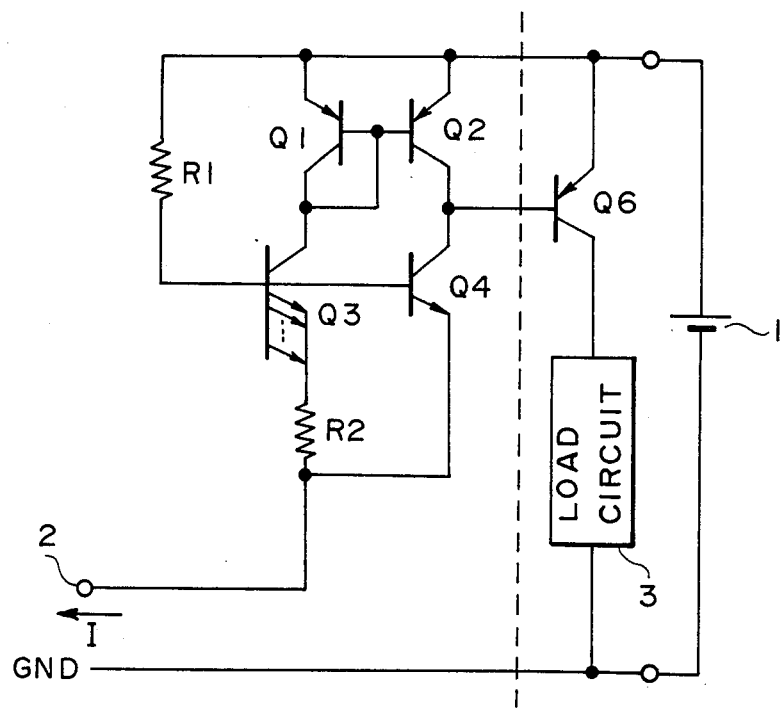

FIG. 1 is a circuit diagram of a first embodiment of the switching device according to the present invention.

Referring to the figure, a current mirror-type constant current circuit is formed by PNP transistors Q1 and Q2 having collectors connected to collectors of NPN transistors Q3 and Q4, respectively. The transistors Q3 and Q4 have emitter areas in a ratio of n:1 (n>1). The bases of the transistors Q3 and Q4 are commonly connected through a resistor R1 to a positive electrode of a power supply 1, whereby the transistors Q3 and Q4 are biased to a constant level. It is sufficient that the resistor R1 has a high resistance, but a constant-current device such as an FET may also be used. The emitter of the transistor Q3 is connected through a resistor R2 and the emitter of the transistor Q4 is connected directly, respectively, to an input terminal 2.

Further, the collector of the transistor Q2 is connected to the base of a PNP transistor Q6. The emitter of the transistor Q6 is connected to the positive electrode of the supply 1, and the collector of the transistor Q6 is connected through a load circuit 3 to a grounding line GND. As the negative electrode of the supply 1 is connected to the grounding line GND, the load circuit 3 is driven by an ON-OFF operation of the transistor Q6. The emitters of the transistors Q1 and Q2 are both connected to the positive electrode of the supply 1 and receive currents therefrom.

In the circuit arrangement as described above, the transistor Q6 is turned on or off depending on whether a current flowing to the input terminal exceeds a certain threshold $I_{th}$. The threshold $I_{th}$ is set by the ratio n of the emitter area of the transistor Q3 to that of the transistor Q4 and the resistor R2 connected to the emitter of the transistor Q3 as will be described hereinafter.

Then, the switching operation of this embodiment having the above mentioned arrangement will be explained.

First, when the current I is small, the collector current $I_{c3}$ of the transistor Q3 becomes larger than the collector current Ic₄ of the transistor Q4 (Ic₃>Ic₄), since the emitter area of the transistor Q3 is larger than that of the transistor Q4. As the transistors Q1 and Q2 constitute a current mirro-type constant current circuit, however, the transistor Q2 biased by the transistor Q1 is placed in a state where a current substantially equal to the collector current Ic₃ flows therethrough, whereby the collector potential of the transistor Q4 rises to near the voltage of the supply 1. As a result, the transistor Q6 retains its "OFF" state so that no current is supplied to the load circuit.

As the current I increases gradually, the current Ic₃ also increases to result in an increased voltage drop at the resistor R₂. Accordingly, the base-emitter voltage of the transistor Q4 increases preferentially to that of the transistor Q3. Nevertheless, unless the current I reaches the threshold $I_{th}$ determined by the emitter area ratio n between the transistors Q3 and Q4 and the resistor R2, the condition of Ic₃>Ic₄ is retained so that the transistor Q6 remains in the "OFF" state.

Then, when the current I further increases to exceed the threshold $I_{th}$, a state of Ic₃<Ic₄ results with respect to the collector currents of the transistors Q3 and Q4. As the collector current of the transistor Q2 biased by the transistor Q1 is Ic₃, the collector potential of the transistor Q4 is lowered so that the transistor Q6 is turned on and a current is supplied to the load circuit 3 from the supply 1.

The method of determining the threshold $I_{th}$ in the above mentioned switching operation will now be explained with reference to current relationship formulas and FIG. 2.

Figure 2:
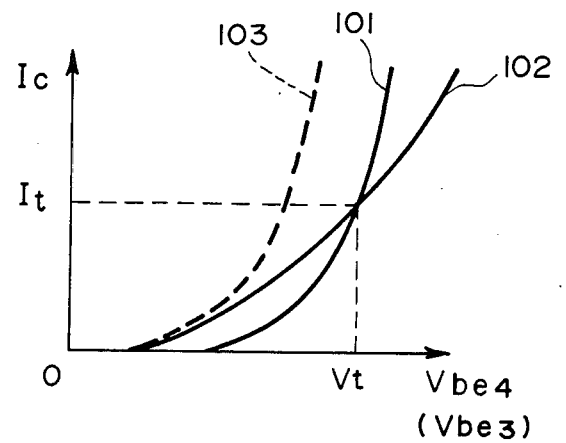
FIG. 2 is a graph showing a relationship between base-emitter electrodes and collector currents for two transistors having different emitter areas.

FIG. 2 is a graph showing a relationship among the base-emitter voltages and the collector currents of two transistors having different emitter areas.

As the emitter area of the transistor Q3 is n times that of the transistor Q4, the collector currents Ic₃ and Ic₄ of the transistors Q3 and Q4 are respectively expressed by the following formulas:

$$Ic_3 = n \cdot Is \cdot \exp(q \cdot Vbe_3/kT) \quad (1), \text{ and}$$

$$Ic_4 = Is \cdot \exp(q \cdot Vbe_4/kT) \quad (2),$$

wherein k is the Boltzmann's constant, q a unit charge, T an absolute temperature, and Vbe₃ and Vbe₄ base-emitter voltages of the transistors Q3 and Q4, respectively.

Further, as the resistor R2 is connected to the emitter of the transistor Q3, there is a relationship between Vbe₃ and Vbe₄ as follows:

$$Vbe_3 + Ic_3 \cdot R2 = Vbe_4 \quad (3).$$

Then, by combining the equation (3) and the equation (1), the following equation is obtained:

$$Ic_3 = n \cdot Is \cdot \exp\{q(Vbe_4 - Ic_3 \cdot R2)/kT\} \quad (4).$$

FIG. 2 shows curves 101 and 102 which graphically represents the above equations (2) and (4), while the curve 103 represent the above equation (1) with Vbe₃ as the abscissa As apparent from the graph, the curve 102 showing the collector current Ic₃ of the transistor Q3 and the curve 101 showing the collector current Ic₄ of the transistor Q4 intersect with each other when $Vbe_4 = V_t$. In other words, the quantitative relationship between Ic₃ and Ic₄ is inverted at this point as the boundary. At this time, $Ic_3 = Ic_4 = I_t$. By combining the equations (2) and (4) with the above relationship, the following relationship is obtained.

$$(kT/q) \cdot \log n = I_t R2 \quad (5)$$

Based on this relationship, the threshold $I_{th}$ may be set to $2I_t$ which is a current at the time when the quantitative relationship is reversed. In other words, the threshold $I_{th}$ can be set to a desired level by determining the emitter area ratio n and the resistance of the resistor R2 based on the relationship of the equation (5).

FIG. 3 is a circuit diagram of a second embodiment of the switching device according to the present invention.

This embodiment is substantially the same as the first embodiment shown in FIG. 1. More specifically, in the second embodiment of the switching device shown in FIG. 3, the emitter of the transistor Q3 is connected through the resistor R2 and the emitter of the transistor Q4 is connected directly, respectively, to the base of a transistor Q5. The base of the transistor Q5 is further connected through a resistor R3 to the input terminal 2 to which is further connected to the emitter of the transistor Q5.

In this circular arrangement, the transistor Q6 is turned on or off depending on whether the current I flowing to the input terminal 2 exceeds a threshold $I_{th}$ as in the case shown in FIG. 1. The threshold is set by the ratio of the emitter area of the transistor Q3 to that of the transistor Q4 and the resistor R2 connected to the emitter of the transistor Q3 as in the first embodiment. In addition, the upper limit of the current I is set by the transistor Q5 and the resistor R3.

The operation of the second embodiment will now be explained hereinbelow, wherein the operations other than a current suppressing operation by the transistor Q5 and the resistor R3 are the same as those of the first embodiment explained with reference to FIG. 1 and explanation thereof is omitted.

In the embodiment shown in FIG. 3, when the current I exceeds the threshold and further increased, the voltage drop due to the resistor R3 increases. Thus, the base-emitter voltage Vbe₅ of the transistor Q5 increases so that the transistor Q5 is turned on and the collector current starts to flow. By this operation, the base potentials of the transistors Q3 and Q4 begin to be lowered and, correspondingly, the currents Ic₃ and Ic₄, i.e., the current I, are decreased. By this operation, the current I is suppressed so that the maximum Imax thereof is determined by Imax=Vbe₅/R3.

Incidentally, the power consumption in the first and second embodiments may be suppressed by increasing the resistance of the resistor R1 within an extent that a current required for driving the transistors Q3 and Q4 is provided. Further, the current consumption may be determined not depending on the voltage of the supply 1 or the voltage at the input terminal 2 by using a constant-current device such as a JFET (junction field effect transistor) or a constant-current circit instead of the resistor R1.

Further, as will be understood from the equation (5) mentioned above, the threshold $I_{th}$ ($=2I_t$) is a function of the temperature T. Accordingly, if the current I is made constant, the switching device according to the invention can be used as a temperature switch.

FIG. 4 is a circuit diagram of a third embodiment of the switching device according to the present invention.

Referring to FIG. 4, a current mirror-type constant current circuit is constituted by a PNP transistor Q402 and a PNP transistor Q403. The collectors of the PNP transistor Q402 and Q403 are connected to collectors of NPN transistors Q404 and Q405, respectively. The transistors Q404 and Q405 have emitter areas in a ratio of n:1 (n>1). The bases of the transistors Q404 and Q405 are both connected to the collector of an NPN transistor Q401 and also connected to the positive electrode of a power supply 402 through a resistor 401, whereby the transistors Q404 and Q405 are biased. It is sufficient that the resistor R401 has a high resistance, but a constant-current device such as an FET may also be used. The emitter of the transistor Q404 is connected through a resistor R2 and the emitter of the transistor Q405 is connected directly, respectively, to an input terminal 401.

Further, the collector of the transistor Q405 is connected to the bases of PNP transistors Q406 and Q407. The emitters of the transistors Q406 and Q407 are connected to the positive electrode of the supply 402. The collector of the transistor Q406 is grounded through a resistor R403 and the collector of the transistor Q407 is grounded through a load circuit 403. Further, the base of the transistor Q401 is also grounded through the resistor R403, and the emitter is directly grounded.

As the negative electrode of the supply 402 is grounded, the load circuit 403 is driven by turning on or off of the transistor Q407. Further, the emitters of the transistors Q402 and Q403 are both connected to the positive electrode of the supply 402 and receive a current therefrom.

In the circuit arrangement as described above, the transistor Q7 is turned off when the current I flowing to the input terminal 401 is below a threshold $I_{th}$ and turned on when the current I is above the threshold $I_{th}$. The threshold $I_{th}$ is set by a ratio n between the emitter areas of the transistors Q404 and Q405 and the resistor R402 connected to the emitter of the transistor Q404. The upper limit of the current I is set by the transistor Q401 and the resistor R403.

The operation of the third embodiment will be explained.

When the current I is below the threshold, as the emitter area of the transistor Q404 is larger than that of the transistor Q405, the collector current $I_{c4}$ of the transistor Q404 is larger than the collector current $I_{c5}$ of the transistor Q405 ($I_{c4}>I_{c5}$). As the transistor Q402 and the transistor Q403 constitute a current mirror-type constant current circuit, however, the transistor Q403 biased by the transistor Q402 is placed in a state where a current substantially equal to the collector $I_{c4}$ of the transistor Q404 flows through the transistor Q403, whereby the collector potential of the transistor Q405 rises to near the voltage of the supply 402. As a result, the transistor Q407 retains its "OFF" state so that no current is supplied to the load circuit 403. At this time, as the base of the transistor Q406 is at the same potential as that of the transistor Q407, the transistor Q406 remains in the "OFF" state.

As the current I increases, the current $I_{c4}$ also increases to result in an increased voltage drop at the resistor R402. Accordingly, the base-emitter voltage of the transistor Q405 increases relative to that of the transistor Q404. However, unless the current I reaches the threshold $I_{th}$ determined by the emitter area ratio n between the transistors Q404 and Q405 and the resistor R2, the condition of $I_{c4}$ and $I_{c5}$ is retained so that the transistor Q407 remains in the "OFF" state.

Then, when the current I exceeds the threshold $I_{th}$, a state of $I_{c4}<I_{c5}$ is formed with respect to the collector currents of the transistors Q404 and Q405. As the collector current of the transistor Q403 biased by the transistor Q402 is $I_{c4}$, the collector potential of the transistor Q405 is lowered so that the transistor Q407 is turned on and a current is supplied from the supply 402 to the load circuit 403. At this time, a collector current Ir flows to the transistor Q406, whereby a voltage of Ir.R3 is applied to the base of the transistor Q401.

When the current I flowing to the input terminal 401 further increases, the current flowing through the transistor Q407 to the load circuit 403 increases, and also the collector current Ir of the transistor Q406 increases to raise the base potential of the transistor Q401. As the base potential of the transistor Q401 becomes higher, the collector current of the transistor Q401 increases to lower the base potentials of the transistors Q404 and Q405. Corresponding to the lowering in base potential of the transistors Q404 and Q405, the collector currents $I_{c4}$ and $I_{c5}$ decreases so that the input terminal current decreases. Further, as the base potentials of the transistors Q404 and Q405 are lowered, the state of $I_{c4}<I_{c5}$ changes to the state of $I_{c4}>I_{c5}$ to raise the collector potential of the transistor Q405, whereby a current flowing to the load circuit 403 is suppressed. More specifically, as the collector potential of the transistor Q405 rises, the base potential of the transistor Q406 rises to suppress the collector potential of the transistor Q406, so that the base potential of the transistor Q401 is lowered. Accordingly, the transistor Q401 is turned off to raise the base potentials of the transistors Q404 and Q405, whereby the transistors Q404 and Q405 again assume the state of $I_{c4}<I_{c5}$. Through the above described operation, there is set an upper limit to the current supplied to the load circuit 403.

The threshold $I_{th}$ in the above mentioned operation can be effected in the same manner as explained for the first embodiment with reference to the current relationship formulas (1) through (5) and FIG. 2. In this case, the following substitutions should be required: $I_{c4}$ substituted for $I_{c3}$, $I_{c5}$ for $I_{c4}$, $V_{be4}$ for $V_{be3}$ and $V_{be5}$ for $V_{be3}$.

The third embodiment shown in FIG. 4 may also be used as a temperature switch. The resistor R401 can be replaced by a constant current device or circuit as in the foregoing embodiments.

Figure 5:
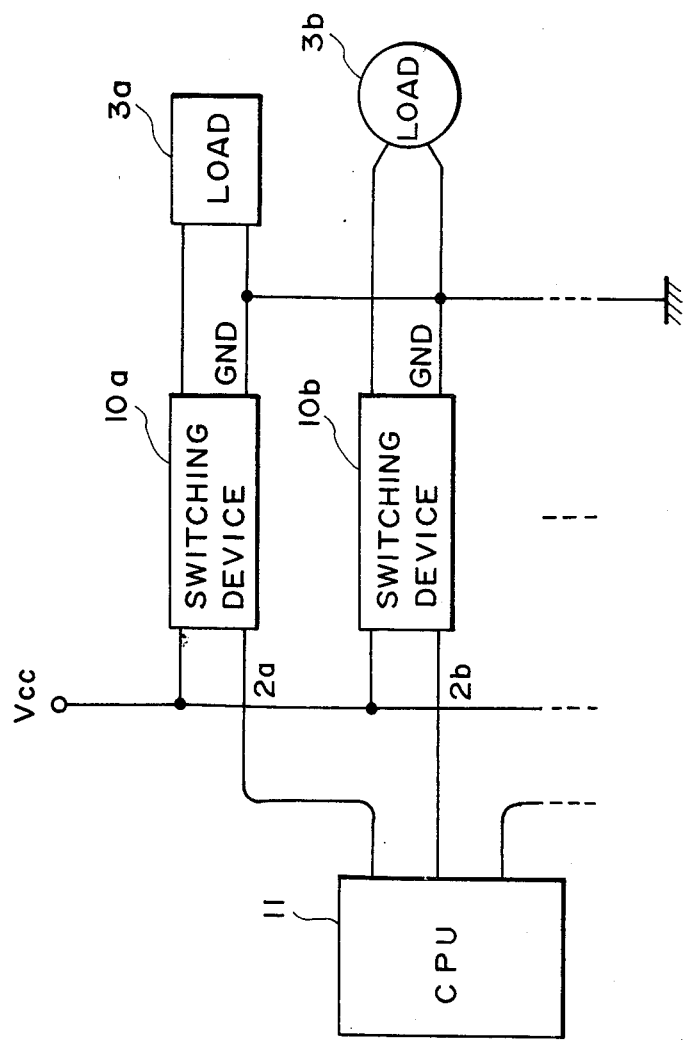
FIG. 5 is a block diagram illustrating an operation mode of an embodiment of the switching device according to the present invention.

FIG. 5 is a block diagram for explaining an example of using the switching device according to the present invention.

Referring to FIG. 5, switching devices 10a, 10b, ... respectively have any one of the circuit structures shown in FIGS. 1, 3 and 4 and are provided in a plurality. To each switching device 10 is connected a load 3a, 3b, ... corresponding to the load circuit shown in FIGS. 1, 3 or 4, which may be an electronic circuit such as an amplifier, an electric motor, etc. A voltage Vcc supplied from a power supply corresponding to one shown in FIGS. 1, 3 or 4 is applied to each switching device, while control signals are supplied to input terminals 2a, 2b, ... of the respective switching devices from a CPU (central processing unit) 11.

As is understood from the foregoing explanation of the operation, a control signal at a high level or a low level is supplied from the CPU 11 so that a current flowing to each input terminal 2a, 2b, . . . changes, and depending on whether the current exceeds the threshold $I_{th}$ or not, each switching device is turned on or off.

By such an arrangement, when a mode wherein a load 3a of an amplifier is not operated and only a load 3b of a motor is operated, is desired, the CPU 11 can supply a current to only the motor 3b by turning off the switching device 10a and turning on the switching device 10b. As a result, it is possible to supply a current to only a circuit or device required for achieving an objective function, whereby a power consumption can be saved as a whole.

Further, as the threshold $I_{th}$ can be easily set, the switching device can be exchangeably used for CPUs issuing different levels of control signals and can therefore be used widely as a switching means.

Further, as there may be provided means for suppressing an input current and a current flowing to a load circuit when the current flowing to the load circuit exceeds the upper limit, the load circuit and the input circuit can be protected from an overcurrent. For example, when an overcurrent is supplied to the load 3a of an amplifier, only the current to the input 2a for the switching device 10a is suppressed, so that operation of the CPU is not affected thereby and the load 3b of a motor can be operated normally.

It will be easily understood that a switching device according to the present invention may also be constituted by modifying the embodiment shown in FIGS. 1, 3 or 4 in such a manner that the NPN transistors are replaced by PNP transistors, PNP transistors are replaced by NPN transistors, the polarity of the power supply is inverted, and the direction of the current flowing at the input terminal is reversed.

As has been described in detail, by the switching device according to the present invention, a current is supplied to a load circuit only when a current flowing to an input terminal reaches or exceeds a prescribed threshold, no current is supplied to the loadcircuit even when a minute current such as a leakage current is applied to the input terminal or a noise current occurs. Thus, a reliable switching operation is ensured and a power consumption is minimized. Further, the switching device has a characteristic that all the current except that flowing to the load circuit flows to the input terminal.

Further, as the threshold can be set to a desired level, a current level of an external device connected to the input terminal need not be seriously care about, so that the switching device can be widely used as a switching means.

Further, as the switching device according to the invention has a function of suppressing currents flowing to the input circuit and the load when the current flowing to the load exceeds the upper limit, the input circuit and the load circuit are protected with respect to overcurrent to the load, and when a plurality of loads are driven, breakage of one load does not affect the operation of the other loads. Further, the switching device according to the present invention can be adapted to a wide variety of loads.

What is claimed is:

1. A switching device for supplying a current to a load only when an input current exceeds a prescribed threshold, comprising:
   an input terminal for receiving the input current;
   an output terminal for supplying a current to the load;
   a first transistor and a second transistor each comprising an emitter for passing an emitter current, a base, and a collector for passing a collector current, the emitter of the first transistor having a larger area than the emitter of the second transistor to provide an emitter area ratio exceeding 1;
   a first resistor having a resistance and connected to the emitter of said first transistor;
   a driving transistor having a control electrode connected to the collector of said second transistor; and
   a constant-current circuit connected to said first and second transistors in such a manner as to supply equal currents to said first and second transistors, wherein
   the bases of said first and second transistors being equally biased to a constant level, the sum of the emitter currents of said first and second transistors providing said input current, the collector currents of said first and second transistors reversing their relative magnitude when the input current exceeds said prescribed threshold, thereby to cause a change in potential of the collector of said second transistor and to operate said driving transistor, so that a current is supplied to the load only when the input current exceeds the threshold.

2. A switching device according to claim 1, wherein said threshold has been set to a desired level by the emitter area ratio between said first and second transistors and the resistance of said first resistor.

3. A switching device, comprising:
   switching means for supplying a current to a load only when an input current flowing at an input terminal exceeds a prescribed threshold, said threshold being set to a desired level, wherein said switching means comprises:
   a first transistor and a second transistor each comprising an emitter for passing an emitter current, a base, and a collector for passing a collector current, the emitter of the first transistor having a larger area than the emitter of the second transistor to provide an emitter area ratio exceeding 1;
   a first resistor having a resistance and connected to the emitter of said first transistor;
   a driving transistor having a control electrode connected to the collector of said second transistor;
   a constant-current circuit connected to said first and second transistors in such a manner as to supply equal currents to said first and second transistors, wherein
   the bases of said first and second transistors being equally biased to a constant level, the sum of the emitter currents of said first and second transistors providing said input current, the collector currents of said first and second transistors reversing their relative magnitude when the input current exceeds said prescribed threshold, thereby to cause a change in potential of the collector of said second transistor and to operate said driving transistor, so that a current is supplied to the load only when the input current exceeds the threshold, and
   current suppressing means for providing an upper limit to said current flowing to the input terminal.

4. A switching device according to claim 3, wherein said threshold have been set to a desired level by the emitter area ratio between said first and second transistors and the resistance of said first resistor.

5. A switching device, comprising:

switching means for supplying a current to a load only when an input current flowing at an input terminal exceeds a prescribed threshold, said threshold being settable to a desired level, wherein said switching means comprises:

a first transistor and a second transistor each comprising an emitter for passing an emitter current, a base, and a collector for passing a collector current, the emitter of the first transistor having a larger area than the emitter of the second transistor to provide an emitter area ratio exceeding 1;

a first resistor having a resistance and connected to the emitter of said first transistor;

a driving transistor having a control electrode connected to the collector of said second transistor;

a constant-current circuit connected to said first and second transistors in such a manner as to supply equal currents to said first and second transistors, wherein the bases of said first and second transistors being equally biased to a constant level, the sum of the emitter currents of said first and second transistors providing said input current, the collector currents of said first and second transistors reversing their relative magnitude when the input current exceeds said prescribed threshold, thereby to cause a change in potential of the collector of said second transistor and to operate said driving transistor, so that a current is supplied to the load only when the input current exceeds the threshold; and current-suppressing means for providing an upper limit to said current flowing to the load, wherein said current suppressing means functions to detect the current to the load and suppresses the input current and the current to the load by lowering base potentials of said first and second transistors, when the current to the load has reached or exceeded the upper limit.

6. A switching device according to claim 5, wherein said threshold have been set to a desired level by the emitter area ratio between said first and second transistors and the resistance of said first resistor.

* * * * *

UNITED STATES PATENT AND TRADEMARK OFFICE
CERTIFICATE OF CORRECTION

PATENT NO. : 4,758,773

DATED : July 19, 1988

INVENTOR(S) : Ikuo Fushimi, et al.

It is certified that error appears in the above-identified patent and that said Letters Patent is hereby corrected as shown below:

COLUMN 1

Line 18, change "proglems" to --problems--.

COLUMN 2

Line 64, change "Then," to --Now,--.

COLUMN 3

Line 4, change "mirro-type" to --mirror-type--;

Line 15, change "$Q_4$" to --Q4--;

Line 60, change "represents" to --represent--;

Line 61, change "represent" to --represents--.

Line 62, change "abscissa" to --abscissa.--.

COLUMN 4

Line 5, change "$I_t R2$" to --$I_t.R2$--;

UNITED STATES PATENT AND TRADEMARK OFFICE
CERTIFICATE OF CORRECTION

PATENT NO. : 4,758,773

DATED : July 19, 1988

INVENTOR(S) : Ikuo Fushimi, et al.

Page 2 of 3

It is certified that error appears in the above-identified patent and that said Letters Patent is hereby corrected as shown below:

Line 24, change "to which" to --which--;

Line 43, change "increased," to --increases,-- and

Line 61, change "circit" to --circuit--.

COLUMN 5

Line 37, change "transistor Q7" to --transistor Q407--; and

Line 55, after "collector" insert --current--.

COLUMN 6

Line 25, change "decreases" to --decrease--;

Line 41, change "above mentioned" to --above-mentioned--; and

Line 47, change "$Vbe_3$." to --$Vbe_4$.--.

COLUMN 7

Line 40, change "loadcircuit" to --load circuit--; and

Line 50, change "seriously care about," to --a serious concern--.

UNITED STATES PATENT AND TRADEMARK OFFICE
CERTIFICATE OF CORRECTION

PATENT NO. : 4,758,773

DATED : July 19, 1988

INVENTOR(S) : Ikuo Fushimi, et al.

Page 3 of 3

It is certified that error appears in the above-identified patent and that said Letters Patent is hereby corrected as shown below:

COLUMN 8

Line 65, change "threshold have" to --threshold has--.

COLUMN 10

Line 11, change "current suppressing" to --current-suppressing--; and

Line 19, change "threshold have" to --threshold has--.

Signed and Sealed this

Twentieth Day of June, 1989

Attest:

DONALD J. QUIGG

Attesting Officer

Commissioner of Patents and Trademarks